United States Patent [19]
von Gentzkow et al.

[11] Patent Number: 5,376,453
[45] Date of Patent: Dec. 27, 1994

[54] EPOXY RESIN COMPOUNDS IN ADMIXTURE WITH GLYCIDYL PHOSPHORUS COMPOUNDS AND HETEROCYCLIC POLYAMINES

[75] Inventors: Wolfgang von Gentzkow, Kleinsendelbach; Wolfgang Rogler, Moehrendorf; Dieter Wilhelm, Forchheim; Juergen Huber, Erlangen, all of Germany

[73] Assignee: Siemens Aktiengesellschaft, Munich, Germany

[21] Appl. No.: 33,985

[22] Filed: Mar. 19, 1993

Related U.S. Application Data

[63] Continuation of Ser. No. 487,602, Mar. 2, 1990, abandoned.

[30] Foreign Application Priority Data

Mar. 3, 1989 [EP] European Pat. Off. ........ 89103802.8

[51] Int. Cl.$^5$ ............................... C08G 59/20
[52] U.S. Cl. ..................... 428/415; 428/417; 428/901; 523/429; 523/466; 528/27; 528/103; 528/108; 528/367; 528/368; 528/398; 528/399; 525/502; 525/504; 525/505; 525/507
[58] Field of Search ............... 528/27, 103, 108, 367, 528/368; 525/502, 504, 505, 507; 428/415, 417, 901; 523/429, 466

[56] References Cited

U.S. PATENT DOCUMENTS

| | | | |
|---|---|---|---|
| 2,856,369 | 10/1958 | Smith et al. | 549/219 |
| 4,632,973 | 12/1986 | Beck | 528/103 |
| 4,783,345 | 11/1988 | Kleeberg et al. | 427/96 |
| 4,812,490 | 3/1989 | Kleeberg et al. | 523/466 |

FOREIGN PATENT DOCUMENTS 2538675 3/1977 Germany.
2743680 4/1985 Germany.

OTHER PUBLICATIONS

"Chemical Abstracts", vol. 94, No. 24 (Jun. 15, 1981), p. 37, No. 193199u.
"Chemical Abstracts", vol. 91, No. 6 (Aug. 6, 1979), p. 22, No. 40180u.
"Chemical Abstracts", vol. 99, vol. 26, (Dec. 26, 1983), p. 34, No. 213394n.
"Chemical Abstracts", Vo. 106, No. 18, (May 4, 1987), p. 29, No. 139155e.

*Primary Examiner*—Frederick Krass
*Attorney, Agent, or Firm*—Kenyon & Kenyon

[57] ABSTRACT

The invention provides epoxy resin compounds for manufacturing prepregs and composite materials, which can be obtained inexpensively and have good processibility, and provide—without having to add flameproofing agents—virtually inflammable molded materials with a high glass transition temperature. The epoxy resin compounds contain the following constituents:

(A) an aromatic and/or heterocyclic polyepoxide resin that is free of phosphorous, optionally in a mixture with an aliphatic epoxy resin;

(B) an epoxy-group-containing phosphorous compound and (C) an aromatic polyamine as a curing agent.

16 Claims, No Drawings

EPOXY RESIN COMPOUNDS IN ADMIXTURE WITH GLYCIDYL PHOSPHORUS COMPOUNDS AND HETEROCYCLIC POLYAMINES

This application is a continuation of application Ser. No. 487,602 filed Mar. 2, 1990, now abandoned.

FIELD OF THE INVENTION

The invention relates to epoxy resin compounds for manufacturing prepregs [preimpregnated material] and composite materials as well as to the prepregs and composite materials manufactured from these epoxy resin compounds.

BACKGROUND OF THE INVENTION

Composite materials based on epoxy resins and inorganic or organic reinforcing agents have attained considerable importance in many areas of technology and daily life. This is due, on the one hand, to the fact that the epoxy resins can be processed relatively simply and safely and, on the other hand, to the good mechanical and chemical property level of the cured epoxy resin molded materials. This property level permits the epoxy resin materials to be adapted to diverse application purposes and allows the properties of the materials sharing in the composite to be used advantageously.

Epoxy resins are advantageously processed into composite materials via the manufacturing of prepregs. For this purpose, inorganic or organic reinforcing agents, respectively insertion components, in the form of fibers, fleece and fabric or textile materials are impregnated with the resin. In most cases, this is accomplished with a solution of the resin in an easily vaporizable or volatilizable solvent. The prepregs obtained after this process must not adhere anymore, but they also should not be cured yet; on the contrary the resin matrix should be merely in a prepolymerized state. In addition, the prepregs must be sufficiently stable in storage. Thus, for example, a storage stability of at least three months is required for manufacturing printed-circuit boards. In the subsequent processing into composite materials, the prepregs must furthermore fuse when there is a rise in temperature and must bind together under pressure with the reinforcing agents or insertion components as well as with the materials provided for the composite as compactly and permanently as possible; that is the cross-linked epoxy resin matrix must form a high degree of interfacial adherence with the reinforcing agents, as well as with the materials to be bonded together, such as metallic, ceramic, mineral and organic materials.

In the cured state, high mechanical and thermal stability as well as chemical resistance and heat deformation resistance or age resistance are generally required of the composite materials. For electrotechnical and electronic applications there is additionally the requirement for long-lasting, high electrical insulating properties. There are also a multitude of additional requirements for special application purposes. Required for the application as printed-circuit board material are, for example, a high-degree of dimensional stability over a broad temperature range, good adherence to glass and copper, high surface resistance, a low dielectric loss factor, good machining quality (punching capability, boring capability), minimal water absorption and high corrosion resistance.

With increasing stress and intensive use of the composite materials, the requirement for heat deformation resistance is given special importance. This means that during processing and use, the materials must withstand high temperatures without the composite becoming deformed or damaged, for example as the result of delamination. Printed-circuit boards, for example, are exposed to a temperature of 270° C. during flow soldering. In the same way, during cutting and boring operations, temperatures of over 200° C. can occur locally for brief periods. Materials with a high glass transition temperature $T_G$ exhibit favorable characteristics. If this glass transition temperature lies above the mentioned values, then inherent stability is guaranteed and damages such as warping and delamination are largely ruled out over the entire temperature range covered during processing. The epoxy resin currently used world-wide on a large scale for FR4 laminates has a glass transition temperature after curing of only 130° C. This leads however to damages and breakdowns in manufacturing as described. Therefore, for quite some time there has been a need for cost-effective materials with comparatively good processibility and a glass transition temperature of over 200° C.

A further requirement that has recently gained in importance is the requirement for flame resistance. In many areas, this requirement is given first priority—due to the danger to human beings and material assets—, for example in structural materials for airplane and motor vehicle construction and for public transportation vehicles. In electrotechnical and particularly electronic applications, it is absolutely necessary for the printed-circuit board materials to be flame resistant—due to the substantial worth of the electronic components assembled on them.

To assess burning behavior, one of the most demanding material testing standards must be withstood, namely the V-O rating according to UL 94V. In this test, a defined flame is applied vertically to the lower edge of a test piece. The sum of the combustion periods for ten tests must not exceed 50 s. This requirement is difficult to fulfill, especially when the wall thicknesses are thin, as is usually the case in electronics. The epoxy resin used in technical applications world-wide for FR4 laminates fulfills these requirements only because, as far as the resin is concerned, it contains approximately 30 to 40% core-brominated, aromatic epoxy components, that is approximately 17 to 21% bromine. For other application purposes, comparatively high concentrations of halogen compounds are used and are even often combined with antimony trioxide as a synergist. The difficulty associated with these compounds is that, on the one hand, they may be very effective as flameproofing agents, but, on the other hand, they possess very dangerous properties. Thus, antimony trioxide is on the list of carcinogenic chemicals. Also, in thermal decomposition, aromatic bromine compounds not only split off bromide radicals and hydrogen bromide, which lead to pronounced corrosion, but also when decomposing in the presence of oxygen, the highly brominated aromatic hydrocarbons in particular can also form highly toxic polybromodibenzofurans and polybromodibenzodioxins. Furthermore, there are considerable difficulties involved in the disposal of bromine-containing waste materials and toxic waste.

Materials, which comply with the requirement for increased resistance to heat deformation or even fulfill this requirement are for example molded materials based on bismaleinimid/triazine (BT) with a $T_G$ of approximately 200° C. or polyimide (PI) with a $T_G$ of 260° to 270° C. Recently, BT epoxy blends with a $T_G$ of 180° C. are also being offered. Laminates manufactured with these resin systems, however, exhibit worse processing and machining qualities than laminates based on epoxy resin. Thus, for example, manufacturing laminates on a polyimide base necessitates molding temperatures of about 230° C. and considerably longer after-curing times (about eight hours) at temperatures of 230° C. Other serious disadvantages of the polyimides are the low [level of] interlaminar adhesion, which causes delamination in die cutting operations and requires considerably more expensive and time-consuming machining processes, such as sawing or milling, as well as the high level of moisture absorption, which necessitates a costly drying operation (two hours at 120° to 140° C.) for the laminates and prepregs before the molding operation. In addition to this is the fact that in the machining of molded materials based on PI and BT, the borer is subject to greater wear resulting from the preparation of the fitting holes. Another serious disadvantage of these resin systems is that their material cost is six to ten times higher.

A comparatively cost-effective resin system is obtained when aromatic and/or heterocyclic polyepoxide resins, that is when polyglycidyl compounds are combined with aromatic polyamines as curing agents. These types of polyamines, known for example from the German Patent 27 43 680, result in network polymers that are particularly stable to heat-deformation and age resistant. From the European Published Patent Application 0 274 646, one can see that when 1.3.5-tris(3-amino-4alkylphenyl- 2.4.6-trioxo-hexahydrotriazines are used as curing agents, laminates are obtained, which exhibit glass transition temperatures of up to 245° C. and are distinguished by a good processing and machining quality.

Even when the mentioned resin systems exhibit widely differing burning behaviors, the disadvantage of being inherently not flame retardant enough applies to all of them. Therefore, to fulfill the requirement indispensable for many application purposes, namely withstanding the fire test according to UL 94V with the rating V-O, one cannot do without the application of highly effective, bromine-containing flameproofing agents. The result is that one must put up with the potential danger associated with bromine compounds, on the one hand, and with a deterioration of the thermomechanical property level caused by the bromine compounds, on the other hand. It is known namely that adding core-brominated aromatic hydrocarbons brings about a reduction of the glass transition temperature. It was found, for example, that the glass transition temperature of polyimides is reduced by 40° to 70° C. when bromine compounds are added (c.f.:"Polymer Journal", vol. 20 (1988), pp 125 fol). In the epoxy and polyamine systems described in the European Published Patent Application 0 274 646, a reduction of the $T_G$ by approximately 50° C. to values of below 200° C. is found when the epoxy component is partially replaced by the corresponding brominated compound, meaning a total bromine concentration of 4%.

For these reasons, there have been many attempts to replace the bromine-containing flameproofing agent with less problematical substances. For example, fillers with a quenching gas effect were suggested, such as hydrated aluminum oxides (c.f.: "J. Fire and Flammability", vol. 3 (1972), pp 51 fol), alkaline aluminum carbonates (c.f.: "Plast. Engng.", vol. 32 (1976), pp 41 fol) and magnesium hydroxides (European Published Patent Application 0 243 201), as well as vitrifying fillers, such as borates (c.f.: "Modern Plastics", vol. 47 (1970), No. 6 pp 140 fol) and phosphates (U.S. Pat. No. 2,766,139 and 3,398,019). Associated with all of these fillers is the disadvantage however, that in part they cause the mechanical, chemical and electrical properties of the composite materials to deteriorate considerably. Moreover, they require special, for the most part more expensive processing techniques, since they tend to sediment and because they increase the viscosity of the filled resin system.

The flame-retarding effectiveness of red phosphorus has also been previously described (British Patent 1,112,139), possibly combined with finely dispersed silicon dioxide or hydrated aluminum oxide (U.S. Pat. No. 3,373,135). Materials are thereby obtained which—due to the phosphoric acid that forms in the presence of moisture and the associated corrosion—limit the use for electrotechnical and electronic purposes. Furthermore, organic phosphorous compounds, such as phosphoric acid esters, phosphonic acid esters and phosphines, have been suggested as flame-retarding additives (c.f.: W.C. Kuryla and A.J. Papa "Flame Retardancy of Polymeric Materials", vol. 1, pp 24 to 38 and 52 to 61, Marcel Dekker Inc., New York, 1973). Since these compounds are known for their "plasticizing" properties and are used all over the world on a large scale as plasticizers (British Patent 10,794), this alternative is not very promising either.

It is also possible to use phosphorous compounds, such as epoxy-group-containing phosphorous compounds which are anchorable in the epoxy resin network, to regulate the flame-retardancy of epoxy resins. However, a great many of these compounds are liquid or crystalline, so that using them to regulate the flame-retardancy of epoxy resins is out of the question. This is because they either distinctly lower the softening point of the solid resins, cause stickiness, or—in the case of crystalline compounds—recrystallize (c.f.: German Published Patent Application 25 38 675). Therefore, in all known publications, epoxy-group-containing phosphorus compounds are first converted in a prereaction with bisphenols or phenolic resins (German Published Patent Application 25 38 675 and Japanese Published Patent Application 58-185631), with dicarboxylic acids (c.f.: "Vysokomol. Soedin.", Ser. B. 29 (1), pp 45 to 47 (1987)), or with polyester resins from dihydroxy compounds and dicarboxylic acids (Japanese Published Patent Application 50-043221). Only then are they cured—primarily ionically—in a mixture with the epoxy resins. However, the flame resistance that is attained is negligible. Thus, for example, for resins obtained through a prereaction with bisphenols, LOI values (Limiting Oxygen Index) of 23.5 to 24 are attained (c.f. German Published Patent Application 25 38 675). These are values that one would find combustible materials, such as wool (LOI=25), while the LOI values for known flame retardant materials, such as polysulphone (LOI=30), polyvinyl chloride (LOI=42), polyvinylidene chloride (LOI=60) and polytetrafluoroethylene (LOI=95), lie considerably higher (c.f.: D.W. v. Krevelen "Properties of Polymers", Elsevier Scientific Publishing Comp., Amsterdam, Oxford, New York, 1976, pp 525 fol). In the case of the conversion products of polyester resins with triglycidyl phosphates (c.f.: Japanese Published Patent Application 50-043221), even halogen compounds and antimony trioxide must be added to regulate the flame retardancy of polyester fibers.

The thermomechanical properties of the molded materials obtained during hardening, however, are likewise insufficient. Thus, for example, a $T_G$ of 45° to 80° C. is obtained during the aminic hardening of epoxy resins resulting from methyl diglycidyl phosphonate and dicarboxylic acids (c.f. "Vysokomol. Soedin.", Set. B. 29 (1), pp 45 to 47 (1987)). This conforms with the experience that phosphoric acid ester groupings, both in the main polymer chain as well as in the side chain, basically cause a plasticization and thus a lowering of the glass transition temperature (c.f. "Journal of Macromolecular Science", Vol. C1, No. 1 (1967), pp 1 fol.).

Therefore, it is an object of the invention to provide epoxy resin compounds for manufacturing prepregs and composite materials which can be obtained inexpensively and are comparable in processibility to epoxy resins found in technical applications.

It is a further object of the invention to provide epoxy resin compounds which yield inflammable molded materials or composite materials having a highest possible glass transition temperature (of $>>200°$ C.), and which can be rated at V-O according to UL 94V without having to add halogen compounds or antimony trioxide.

SUMMARY OF THE INVENTION

The foregoing objects are achieved by the invention which provides epoxy resin compounds containing the following constituents:
- (A) an aromatic and/or heterocyclic polyepoxide resin that is free of phosphorous, optionally in a mixture with an aliphatic epoxy resin;
- (B) an epoxy-group-containing phosphorous compound of the following structure:

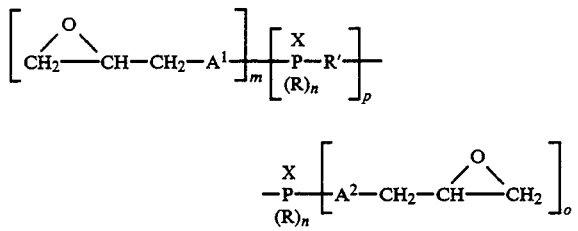

with m=0 or 1, n=0, 1 or 2 and o=1, 2 or 3, where the following holds: m+n+o=3, and with p=0, 1 or 2; and where
X signifies a free electron pair or an O-or S-atom linked via double bond;
R signifies an alkyl residue having 1 to 4 C-atoms; alkenyl residue having 2 to 3 C-atoms; aryl residue such as phenyl, alkoxyphenyl, nitrophenyl, naphthyl and biphenyl; aryl alkyl residue such as benzyl; dialkylamino residue or alkyl-aryl-amino residue or 3-trialkylsilylpropyl residue; R being linked directly or via O or S;
R' denotes a cross-linkage of O, S, phenylene, dioxyphenylene, dioxynaphthylene, $(CH_2)_r$, $O—CH_2)_r$ or $O—(CH_2)_r—O$ with r=1 to 3; and
$A^1$ and $A^2$, which can be the same or different, denote a single bond or a cross-linkage according to the grouping R¹; and
- (C) an aromatic polyamine as a curing agent having the following structure:

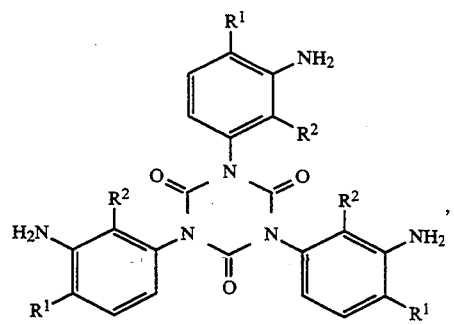

where on each of the three aromatic partial structures, one of the residues $R^1$ and $R^2$ respectively denotes H and the other alkyl.

It was discovered as a complete surprise that both the inflammability as well as the mechanical stability of the resultant reaction resin molded materials are distinctly improved when a combination of constituents of the aforesaid type is applied; that is of (phosphate-free) aromatic and/or heterocyclic polyepoxide resins, epoxy-group-containing phosphorous compounds and polyamines (as curing agents). Moreover, it was surprising to discover that the combination of the constituents (A), (B), and (C) according to the invention is able to be processed cost-effectively and comparably or even better than the epoxy resins found in technical applications. The prereaction of liquid or crystalline epoxy-group-containing phosphorous compounds with bisphenols or dicarboxylic acids, described as necessary in the prior art, is therefore not required.

DETAILED DESCRIPTION OF THE INVENTION

In the epoxy resin compounds of the invention, the following compounds are particularly suited as a polyepoxide resin, that is as a polyglycidyl compound: aromatic polyglycidyl ethers, such as bisphenol-A-diglycidyl ether, bisphenol-F-diglycidyl ether and bisphenol-S-diglycidyl ether; polyglycidyl ethers of phenol/formaldehyde resins and cresol/formaldehyde resins; resorcinol diglycidyl ether and tetrakis (p-glycidylphenyl) ethane; di-or polyglycidyl esters of phthalic, isophthalic and terephthalic acid as well as of trimellitic acid; N-glycidyl compounds of aromatic amines and heterocyclic nitrogen bases, such as N.N-diglycidyl-aniline, N.N.O-triglycidyl-p-aminophenol, triglycidyl isocyanurate and N.N.N'.N'-tetraglycidyl-bis (p-aminophenyl)-methane; hydantoin epoxy resins and uracil epoxy resins; as well as di-and polyglycidyl compounds of polyvalent aliphatic alcohols, such as 1.4-butanediol, trimethylol propane and polyalkylene glycols. Furthermore, modified epoxy resins are also suited as constituent (A), for example oxazolidinone-modified epoxy resins. These types of compounds are already known (c.f. "Angew. Makromol Chem." Vol 44 (1975), pp 151 to 163, as well as U.S. Pat. No. 3,334,110); mentioned for this purpose as an example is the conversion product of bisphenol-A-diglycidyl ether with diphenylmethane diisocyanate (in the presence of a suitable accelerator). The conversion products of epoxy resins with amine-modified bismaleinimides are mentioned as further examples of modified epoxy resins. The polyepoxide resins can be present in the epoxy resin compounds according to the invention, singly or in a mixture. An epoxidized novolak preferably with a hydrolyzable halogen concentration of <0.1%, is preferably used as a polyepoxide resin.

The constituent (B) of the epoxy resin compounds can also find application both in the form of single compounds as well as in the form of a mixture of several compounds. The following epoxy-group-containing phosphorous compounds, all of which are already known, are suited for example as constituent (B): methyl diglycidyl phosphonate, ethyl diglycidyl phosphonate, propyl diglycidyl phosphonate, butyl diglycidyl phosphonate, vinyl diglycidyl phosphonate, phenyl diglycidyl phosphonate and biphenyl diglycidyl phosphonate; methyl diglycidyl phosphate, ethyl diglycidyl phosphate, n-propyl diglycidyl phosphate, n-butyl diglycidyl phosphate, isobutyl diglycidyl phosphate, allyl diglycidyl phosphate, phenyl diglycidyl phosphate, p-methoxyphenyl diglycidyl phosphate, p-ethoxyphenyl diglycidyl phosphate, p-propyloxyphenyl diglycidyl phosphate, p-isopropyloxyphenyl diglycidyl phosphate, phenylthiodiglycidyl phosphate, triglycidyl phosphate, tris(glycidylethyl) phosphate, p-glycidylphenyl ethyl glycidyl phosphate and benzyl diglycidyl thiophosphate.

The synthesis of these compounds is accomplished, for example, by reacting phosphonic-acid chlorides or phosphoric-acid chlorides with glycidol (c.f.: "Zh. Obshch. Khim.", Vol. 54, Issue 10 (1984), pp 2404 fol), by reacting phosphoric acid or phosphonic acids with epichlorohydrin (Japanese Published Patent Application 51-143620) or by epoxidizing phosphorous compounds, which contain residues with olefinic double bonds (U.S. Pat. No. 2,856,369).

The mixture ratio (by weight) of the constituents (A) and (B) is able to be varied—in accordance with the desired property spectrum—within a broad range. For certain applications, it is even possible to do completely without the constituent (A). The mixture ratio of (A) to (B) in the case of the epoxy resin compounds advantageously amounts to 10:1 to 1:10 and preferably 4:1 to 1:4, particularly 2:1 to 1:2.

The aromatic polyamines used as curing agents in the epoxy resin compounds according to the invention are already known to some degree. Polyamines of the indicated structure with $R^1$=alkyl and $R^2$=H are described in the European Published Patent Application 0 274 646. They are prepared through the trimerization of 2.4-diisocyanato-alkylbenzenes and the subsequent hydrolysis of the remaining isocyanate groups. Compounds with $R^1$=H and $R^2$=alkyl are obtained analogously through the trimerization of 2.6-diisocyanato-alkylbenzenes and subsequent hydrolysis. In the epoxy resin compounds according to the invention, both the polyamines of the two types named above as well as mixtures of these compounds can be used as constituent (C). Moreover, polyamines can be used, which are obtained through the trimerization of mixtures of 2.4 and 2.6-diisocyanato-alkylbenzene and the subsequent hydrolysis of the trimerization products. These types of mixtures are available on a large scale and permit a cost-effective preparation of the curing agent components.

In the hydrolysis of the isocyanate-group-containing trimerization products, a reaction can occur between the isocyanate groups and the amino groups. Heterocyclic polyamines with urea groupings are thereby obtained as a by-product of the hydrolysis reaction. These types of polyamines can be used as additive curing agent components in the epoxy resin compounds according to the invention, that is they can find application in the mixture with the actual curing agent. Besides the actual curing agent or besides curing agent mixtures of the type named above, aromatic polyamines of a different kind can also be used in the epoxy resin compounds, [aromatic polyamides] such as 4.4'-diaminodiphenyl methane and 4.4'-diaminodiphenyl sulfone, and/or other heterocyclic polyamines. The portion of such polyamines in the curing agent mixtures amounts generally to a maximum of 30% by weight.

In the case of the epoxy resin compounds of the invention, the ratio between the applied epoxy function (constituents A and B) and the applied amino hydrogen function NH (constituent C) can amount to 0.9:1 to 1.5:1, advantageously 0.9:1 to 1.1:1 and preferably about 1:1.

In the manufacturing of prepregs, the individual constituents are dissolved singly or in combination in cost-effective solvents, such as acetone, methyl-ethyl ketone, ethyl acetate, methoxy ethanol and dimethyl formamide, or in mixtures of such solvents. They are optionally combined into one solution and processed on currently available impregnation installations; that is they are used to saturate fibers made of inorganic or organic materials, such as glass, metal, minerals, carbon, aramide polyphenyl sulfide and cellulose as well as fabrics or non-woven fabrics made from these or they are used to coat textile materials, such as films made of metal or plastic. The impregnated or coated reinforcing agents or insertion components are then dried at an elevated temperature, whereby, on the one hand, the solvent is removed and, on the other hand, a prepolymerization of the polyepoxide resin takes place. All in all, an exceptionally favorable ratio results in this manner between the degree of expenditure and the attainable properties.

The coatings and prepregs manufactured in the manner as described above are non-stick and are stable in storage at room temperature for periods of three months and more; in other words their storage stability [shelf life] is adequate. They are able to be molded into composite materials at temperatures of up to 200° C., and these resultant composite materials are distinguished by a high glass transition temperature of 250° to 300° C. and by inherent flame resistance. If one uses glass material, for example, as an insertion material with a mass part [share] of 60 to 62%, then the burning test according to UL 94V is withstood with a safe V-O rating without having to add halogen compounds or other flame-retardant additives, even in the case of test pieces with a wall thickness of 1.6 mm or even only 0.8 mm. It has proven to be especially advantageous, thereby, that no corrosive or particularly toxic cleavage [breakdown] products form and that the smoke production is greatly reduced compared to other polymer materials, particularly compared to bromine-containing epoxy resin molded materials.

The hardened composite materials are also distinguished by a small thermal expansion coefficient, which is constant over a broad temperature range, as well as by high chemical resistance, corrosion resistance, minimal water absorption and excellent electrical property values. The adherence to the reinforcing materials and to the materials to be bonded together is superior. When reinforcing agents of the mentioned type are used, one obtains prepregs suited for mechanically, highly stressable construction materials. These construction materials are suited, for example, for applications in machine and automobile construction, and in aeronautics and in electrical engineering, for example in the form of prepregs for printed-circuit board production, and particularly for the production of multi-layer circuits as well.

Particularly advantageous for the application as printed-circuit board material is the high level of adherence of circuit-board conductors made of copper, the high resistance to delamination and an excellent machinability, as evidenced for example by the boring of plated contacting holes, so that perfect bore holes are obtained with minimal borer wear. Thus, two-layer and multi-layer printed-circuit boards can be produced more safely or more cost-effectively with the materials manufactured according to the invention than is possible with materials representing the current state of technological development. In the case of the FR4 materials currently used on a large scale in printed-circuit board technology, bore holes must be subsequently etched free to allow for the following electrically conductive connection of the copper layers. In printed-circuit board production, apart from the higher cost of materials and more costly process technology for printed-circuit materials on a polyimide base, one also has to expect greater borer wear.

The invention shall be explained in greater detail based on exemplified embodiments.

EXAMPLE 1

Manufacturing of Prepregs

A solution of A parts by weight (MT) of an epoxidized novolak (with an epoxy value of 0.57) in B parts by weight of ethyl-methyl ketone, is mixed with a solution of C parts by weight of a polyamine, which was prepared through the trimerization of a 4:1 mixture of toluene-2.4-diisocyanate and toluene, 2.6-diisocyanate and through subsequent hydrolysis into a product with an $NH_2$ value of 8.7%, in D parts by weight of ethyl-methyl ketone and with E parts by weight of phenyl diglycidyl phosphonate (for preparation c.f.: "Zh. Obshch. Khim.", Vol. 54, Issue 10 (1984), pp 2404 fol). The composition of various epoxy resin compounds can be seen in Table 1. Glass material (binding cloth, substance weight: 197 g/m²) was continuously impregnated with these mixtures and dried in a vertical drying installation at temperatures of 50° to 130° C. Prepregs manufactured in this manner are tack-free and stable in storage at room temperature for periods longer than three months.

TABLE 1

| Test No. | 1 | 2 | 3 | 4 | 5 |
|---|---|---|---|---|---|
| Constituents: | | | | | |
| A (MT) | 66 | 48 | 42 | 34 | 0 |
| B (MT) | 18 | 16 | 14 | 11 | 0 |
| C (MT) | 34 | 36 | 36 | 36 | 40 |
| D (MT) | 34 | 28 | 28 | 24 | 34 |
| E (MT) | 0 | 16 | 22 | 30 | 60 |
| Prepreg: | | | | | |
| Residual concentration of solvent (%) | 0.5 | 0.4 | 0.3 | 0.3 | <0.2 |
| Remaining gel time at 170° C. (s) | 47 | 60 | 65 | 71 | 61 |

To be able to make a comparison with the current state of technology, the polyamine was replaced in a further test by the curing agent dicyandiamide; to date the most widely used industrially. To this end, 60 parts by weight of phenyl diglycidyl phosphonate are mixed with a solution of 9 parts by weight dicyandiamide in 15 parts by weight of dimethyl formamide and with 0.9 parts by weight of dimethyl benzylamine. The attempt was made to continuously impregnate a glass material (binding cloth, substance weight: 197 g/m²) with the thus obtained solution and to guide it through a vertical drying installation at temperatures of 50° to 160° C. It turned out, however, that in spite of varying the drawing speed and temperature profile, it was not possible to manufacture prepregs, since the resin became highly liquid under the drying conditions and flowed down from the glass material. Tests showed that the resin dripping off, which was set free from the solvent residues, cannot be hardened even after 45 minutes at 160° C. and subsequently 120 minutes at 180° C. in a compartment drier. Therefore, one decided not to asses this system any further.

EXAMPLE 2

Manufacturing of Laminates

Eight each of the prepregs obtained according to Example 1 are molded in a molding press at 175° C. and 70 bar. After ten minutes, the 1.6 mm thick laminates are removed from the molding press and subsequently after-cured for two hours at 200° C. The bodies obtained in this manner are tested for their glass transition temperature ($T_G$) and for combustibility according to UL 94V. The values are compiled in Table 2 (the test numbers correspond to those of Example 1).

TABLE 2

| Test No. | 1 | 2 | 3 | 4 | 5 |
|---|---|---|---|---|---|
| Measured values: | | | | | |
| $T_G$ (°C.) | 230 | 250 | 260 | 260 | 260 |
| Average burning time according to UL 94 V (s) | >40 | 4.5 | 1.4 | <1 | 0 |
| Rating | not possible | V-0 | V-0 | V-0 | V-0 |

EXAMPLE 3

Manufacturing of Printed-Circuit Board Base Material

Stacks of eight layers each of the prepregs manufactured according to Example 1 are coated with one copper film each (thickness: 18 μm) on the top and on the bottom and molded at 175° C. and 70 bar for 30 minutes. This so-called base material is subsequently after-cured for two hours in an oven at 200° C. Table 3 contains the test values measured on these materials (the test numbers correspond to those of Example 1).

TABLE 3

| Test No. | 2 | 3 | 4 |
|---|---|---|---|
| Measured values: | | | |
| Adhesiveness of the Cu film at RT (N/mm) | 1.5 | 1.6 | 1.6 |
| Ball test to evaluate the layer bonding | + | + | + |
| Solder bath test at 288° C./20 s | + | + | + |
| Water absorption (mg) | 14 | 16 | 16 |
| Surface resistance (Ohm) | $8 \cdot 10^{13}$ | $8 \cdot 10^{13}$ | $8 \cdot 10^{13}$ |
| Dielectric constant (1 MHz) | 4.82 | 4.88 | 4.85 |
| Average burning time according to IEC 249-1 (s) | 2.4 | 1.2 | <1 |
| Cutting capability according to DIN 53488 | + | + | + |
| Borer wear test | + | + | + |
| After the structuring of the Cu layers: | | | |
| Surface corrosion according | + | + | + |

TABLE 3-continued

| Test No. | 2 | 3 | 4 |
|---|---|---|---|
| to IPC-B-25 Cutting edge corrosion according to IEC 249-1 | + | + | + |

("+" means: passed)

EXAMPLE 4

38 parts by weight of an epoxidized Novolak (with an epoxy value of 0.57) are dissolved in 14 parts by weight ethyl-methyl ketone and mixed with a solution of 14 parts by weight of a polyamine prepared according to Example 1 (with a $NH_2$ value of 8.7%) in 30 parts by weight ethylmethyl ketone, as well as with 22 parts by weight triglycidyl phosphate (for preparation c.f.: "Plaste und Kautschuk" (Plastic and Rubber), Vol.11 (1964), pp 515 fol). The obtained solution is processed into prepregs, as described in Example 1. The residual solvent concentration of the prepregs amounts to 0.3%, the gel time at 170° C. is 35 s. After drying, the prepregs are tack-free and are stable in storage at room temperature for more than three months.

Eight prepregs are each molded in a molding press at 175° C. and 70 bar. After ten minutes, the 1.6 mm thick laminates are removed from the molding press and subsequently after-cured for two hours at 200° C. The glass transition temperature of the bodies obtained in this manner is 300° C.

EXAMPLE 5

One adds a 60% solution of 183 parts by weight of a polyamine corresponding to Example 1 (with an $NH_2$ value of 8.7%) in ethyl-methyl ketone as well as varying parts by weight of a glycidyl-group-containing phosphorous compound (see Table 4) to a 80% solution of 175 parts by weight of an epoxidized novolak (epoxy value: 0.57) in ethyl-methyl ketone. The solution thereby obtained in most cases has a viscosity that is too high for processing into prepregs and is therefore diluted directly at the impregnating installation with additional ethyl-methyl ketone to the extent that 0.22 to 0.23 mm thick prepregs are able to be manufactured by saturating glass material (binding cloth, substance weight: 197 g/m$^2$) and to subsequently drying vertically at 50° to 130° C. After drying, the prepregs are tack-free and at room temperature they are stable in storage for more than three months.

Eight prepregs are each molded in a molding press at 175° C. and 70 bar. After ten minutes, the 1.6 mm thick laminates are removed from the molding press and subsequently after-cured for two hours at 200° C. Table 4 contains the values measured on the laminates.

TABLE 4

| Test No. | 6 | 7 | 8 | 9 | 10 | 11 |
|---|---|---|---|---|---|---|
| Constituents for prepreg manufacturing: | | | | | | |
| Epoxidized novolak [resin] (MT) | 175 | 175 | 175 | 175 | 175 | 175 |
| Polyamine (MT) | 183 | 183 | 183 | 183 | 183 | 183 |
| Methyl-diglycidyl-phosphonate[1] (MT) | 104 | — | — | — | — | — |
| Ethyl-diglycidyl-phosphonate[1] (MT) | — | 111 | — | — | — | — |
| Methyl-diglycidyl-phosphate[2] (MT) | — | — | 112 | — | — | — |
| Ethyl-diglycidyl-phosphate[2] (MT) | — | — | — | 119 | — | — |
| Phenyl-diglycidyl-phosphate[2] (MT) | — | — | — | — | 143 | — |
| p-methoxyphenyl-diglycidyl-phosphate[2] (MT) | — | — | — | — | — | 158 |
| Measured values at the laminate: | | | | | | |
| Glass transition temperature $T_G$ (°C.) | 270 | 270 | 260 | 260 | 270 | 260 |
| Average burning time according to UL 94V (s) | 2.5 | 4.0 | 2.0 | 3.1 | <1 | 2.0 |
| Rating | V-0 | V-0 | V-0 | V-0 | V-0 | V-0 |

[1] c.f. "Zh. Obshch. Khim." 54 (10), 2404 (1984) or C.A. 102 (19) 166845d
[2] c.f. "Isv. Akad. Nauk. SSSR", Ser. Khim. (9), 2006 (1967) or C.A. 68 (7), 29789d

EXAMPLE 6

One adds a 60% solution of 183 parts by weight of a polyamine corresponding to Example 1 (with an $NH_2$ value of 8.7%) in ethyl-methyl ketone, as well as 135 parts by weight of phenyl-diglycidyl phosphonate, to an 80% solution of varying parts by weight of an epoxy resin (see Table 5) in ethyl-methyl ketone. The solution thereby obtained in most cases has a viscosity that is too high for processing into prepregs and is therefore diluted directly at the impregnating installation with additional ethyl-methyl ketone to the extent that 0.22 to 0.23 mm thick prepregs are able to be manufactured by saturating glass material (binding cloth, substance weight: 197 g/m$^2$) and subsequently drying vertically at 50° to 130° C. After drying, the prepregs are tack-free and at room temperature they are stable in storage for more than three months.

Eight prepregs are each molded in a molding press at 175° C. and 70 bar. After ten minutes, the 1.6 mm thick L8 laminates are removed from the molding press and subsequently after-cured for two hours at 200° C. Table 5 contains the values measured on these materials.

TABLE 5

| Test No. | 12 | 13 | 14 | 15 | 16 |
|---|---|---|---|---|---|
| Constituents for prepreg manufacturing: | | | | | |
| Epoxidized novolak[1] (MT) | 185 | 93 | — | — | — |
| Oxazolidinone-modified epoxy resin[2] (MT) | — | 238 | — | — | — |
| Bisphenol-A-diglycidyl ether[3] (MT) | — | — | 175 | — | — |
| Bisphenol-F-diglycidyl ether[4] (MT) | — | — | — | 164 | — |
| Hydantoin epoxy resin[5] (MT) | — | — | — | — | 175 |
| Polyamine (MT) | 183 | 183 | 183 | 183 | 183 |
| Phenyl-diglycidyl-phosphonate (MT) | 135 | 135 | 135 | 135 | 135 |
| Measured values at the laminate: | | | | | |
| Glass transition temperature $T_G$ (°C.) | 275 | 230 | 260 | 255 | 270 |
| Average burning time according to UL 94V (s) | 1.2 | 4.2 | 2.2 | 1.5 | 3.0 |

TABLE 5-continued

| Test No. | 12 | 13 | 14 | 15 | 16 |
|---|---|---|---|---|---|
| Rating | V-0 | V-0 | V-0 | V-0 | V-0 |

[1]Epoxy value: 0.54; viscosity at 150° C.: 600 cSt
[2]Epoxy value: 0.21
[3]Epoxy value: 0.57; viscosity at 25° C.: 4,000 to 6,000 mPa.s
[4]Epoxy value: 0.61; viscosity at 25° C.: 1,200 ± 100 mPa.s
[5]Epoxy value: 0.57; viscosity at 80° C.: 9,000 mPa.s

What is claimed is:

1. An epoxy resin composition for manufacturing prepregs and composite materials, comprising the following constituents:

(A) an aromatic and/or heterocyclic polyglycidyl compound that is free of phosphorous;

(B) an epoxy-group-containing phosphorous compound of the following structure:

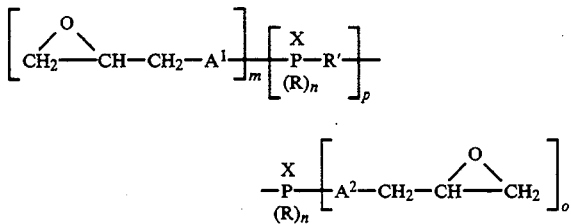

with m=0 or 1, n=0,1 or 2 and o=1, 2 or 3, where the following holds: m+n+o=3, and with p=0, 1 or 2;

X signifies a free electron pair or an O- or S-atom linked via a double bond;

R signifies an alkyl residue having 1 to 4 C-atoms; alkenyl residue having 2 to 3 C-atoms; aryl residue; aryl alkyl residue; dialkyl-amino residue or alkyl-arylamino residue or 3- trialkylsilylpropyl residue;

R being linked directly or via O or S;

R' denotes a bridge of O, S, phenylene, dioxyphenylene, dioxynaphthylene, $(CH_2)_r$, O—$(CH_2)_r$ or O—$(CH_2)_r$—O with r=1 to 3; and $A^1$ and $A^2$, which can be the same or different, denote a single bond or a bridge according to the grouping R'; and (C) an aromatic polyamine as a curing agent of the following structure:

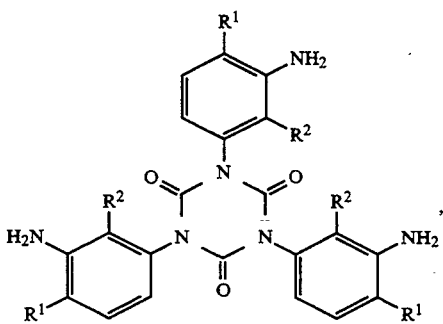

where on each of the three aromatic partial structures, one of the residues $R^1$ and $R^2$ respectively denotes H and the other alkyl.

2. An epoxy resin composition according to claim 1, wherein the constituent (B) is a di- or triglycidylester of phosphoric acid or a mixture thereof.

3. An epoxy resin composition according to claim 1, wherein the constituent (B) is a diglycidylester of an alkyl- or arylphosphonic acid.

4. An epoxy resin composition according to claim 1, wherein the constituent (B) is a di- or triglycidylester of phosphorous acid or a combination thereof.

5. An epoxy resin composition according to claim 1 wherein the weight ratio of the constituent (A) to the constituent (B) is from 10:1 to 1:10.

6. An epoxy resin composition according to claim 5 wherein the ratio of the constituent (A) to the constituent (B) is from 4:1 to 1:4.

7. An epoxy resin composition according to claim 1 wherein the ratio of the epoxy function to the amine-hydrogen function is from 0.9:1 to 1.1:1.

8. An epoxy resin composition according to claim 7 wherein the ratio of epoxy function to amine-hydrogen function is about 1:1.

9. An epoxy resin composition according to claim 1 wherein the constituent (C) is a mixture of polyamines, prepared through the trimerization of a mixture of 2.4- and 2.6-diisocyanato-alkylbenzene and through subsequent hydrolysis.

10. An epoxy resin composition according to claim 1 wherein the constituent (C) is present as a curing agent in a mixture with additional aromatic and/or heterocyclic polyamines.

11. An epoxy resin composition according to claim 10, wherein the concentration of the constituent (C) in the curing agent mixture is at least 70% by weight.

12. An epoxy resin composition according to claim 1 wherein the polyepoxide compound is an epoxidized novolak.

13. An epoxy resin composition according to claim 12 wherein the epoxized novolak has a concentration of hydrolyzable halogen of <0.1% by weight.

14. A prepreg comprising inorganic or organic reinforcing agents in the form of fibers, fleece or fabric impregnated with am epoxy resin composition according to claim 1.

15. A composite material comprising inorganic or organic reinforcing agents in the form of textile materials impregnated with an epoxy resin composition according to claim 1.

16. A printed-circuit board comprising an epoxy resin composition according to claim 1 and a glass material.

* * * * *